US010325648B2

(12) United States Patent
Mehta et al.

(10) Patent No.: US 10,325,648 B2
(45) Date of Patent: Jun. 18, 2019

(54) WRITE DRIVER SCHEME FOR BIT-WRITABLE MEMORIES

(71) Applicant: QUALCOMM Incorporated, San Diego, CA (US)

(72) Inventors: Darshit Mehta, San Diego, CA (US); Chulmin Jung, San Diego, CA (US); Po-Hung Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/379,285

(22) Filed: Dec. 14, 2016

(65) Prior Publication Data

US 2018/0166129 A1 Jun. 14, 2018

(51) Int. Cl.
| | | |
|---|---|---|
| *G11C 11/00* | (2006.01) | |
| *G11C 11/419* | (2006.01) | |
| *G06F 3/06* | (2006.01) | |
| *G11C 7/10* | (2006.01) | |

(52) U.S. Cl.
CPC .......... *G11C 11/419* (2013.01); *G06F 3/0604* (2013.01); *G06F 3/0659* (2013.01); *G06F 3/0673* (2013.01); *G11C 7/1096* (2013.01); *G11C 2207/002* (2013.01)

(58) Field of Classification Search
CPC ... G11C 11/419; G06F 3/0604; G06F 3/0659; G06F 3/0673
See application file for complete search history.

(56) References Cited

U.S. PATENT DOCUMENTS

| | | | |
|---|---|---|---|
| 4,563,754 A | 1/1986 | Aoyama et al. | |
| 6,154,405 A | 11/2000 | Takemae et al. | |
| 7,139,204 B1* | 11/2006 | Behera ................... | G11C 29/16 365/201 |
| 7,379,347 B1* | 5/2008 | Nautiyal ............... | G11C 11/413 365/154 |
| 7,403,426 B2* | 7/2008 | Hamzaoglu ........... | G11C 11/413 365/185.23 |
| 8,351,287 B1 | 1/2013 | Sood et al. | |
| 8,498,168 B2* | 7/2013 | Huang ................. | G11C 29/025 365/185.21 |
| 8,976,607 B2* | 3/2015 | Desai ................... | G11C 7/1096 365/189.05 |
| 8,982,659 B2 | 3/2015 | Chang et al. | |
| 9,177,650 B2* | 11/2015 | Wang .................... | G11C 16/08 |
| 9,496,027 B2* | 11/2016 | Rim ...................... | G11C 11/419 |

(Continued)

FOREIGN PATENT DOCUMENTS

JP 3568605 B2 9/2004

OTHER PUBLICATIONS

International Search Report and Written Opinion—PCT/US2017/064516—ISA/EPO—dated Mar. 28, 2018.

*Primary Examiner* — Pho M Luu
(74) *Attorney, Agent, or Firm* — Arent Fox, LLP and Qualcomm, Incorporated

(57) ABSTRACT

The apparatus provided may be a memory circuit. The memory circuit includes a memory cell. The memory cell has a bitline. The memory circuit also includes a write driver. The write driver is configured to drive the bitline to write a bit to the memory cell during a write operation. The write driver is also configured to float the bitline to mask the bit during a read operation. The write driver may use NMOS pullup transistors.

15 Claims, 8 Drawing Sheets

(56) References Cited

U.S. PATENT DOCUMENTS

| 9,536,578 B2* | 1/2017 | Jung ........................ G11C 7/12 |
| 2011/0317478 A1 | 12/2011 | Chan et al. |
| 2016/0042784 A1 | 2/2016 | Rim et al. |
| 2016/0225437 A1* | 8/2016 | Kumar .................. G11C 11/419 |

* cited by examiner

WRITE DRIVER SCHEME FOR BIT-WRITABLE MEMORIES

BACKGROUND

Field

The present disclosure relates generally to memory systems, and more particularly, to a write driver scheme.

Background

A fin-type Field Effect Transistor (FinFET) is a field effect transistor that includes a fin-shaped source-drain channel protruding from a substrate. The FinFET may save space compared to other transistor layouts. For some semiconductor technologies, however, the fins in a FinFET design may crack. For example, one use of a FinFET device is as part of a memory in a portable computing device. In some memory designs, one or more fins of a FinFET may crack. A cracked fin in a FinFET that is part of a memory may be susceptible to false data writes to the memory.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a memory circuit includes a memory cell having a bitline. The memory circuit also includes a write driver. The write driver is configured to drive the bitline to write a bit to the memory cell during a write operation and to float the bitline to mask the bit during a read operation.

In an aspect of the disclosure, an apparatus is a processing system. The processing system includes a processor. The processing system also includes a memory circuit coupled to the processor. The memory circuit includes a memory cell having a bitline. The memory cell also includes a write driver. The write driver is configured to drive the bitline to write a bit to the memory cell during a write operation and to float the bitline to mask the bit during a read operation.

In an aspect of the disclosure, a memory circuit includes means for storing a bit, the means for storing a bit having a bitline. The memory circuit also includes means for driving the bitline to write the bit to the means for storing the bit during a write operation and to float the bitline to mask the bit during a read operation.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
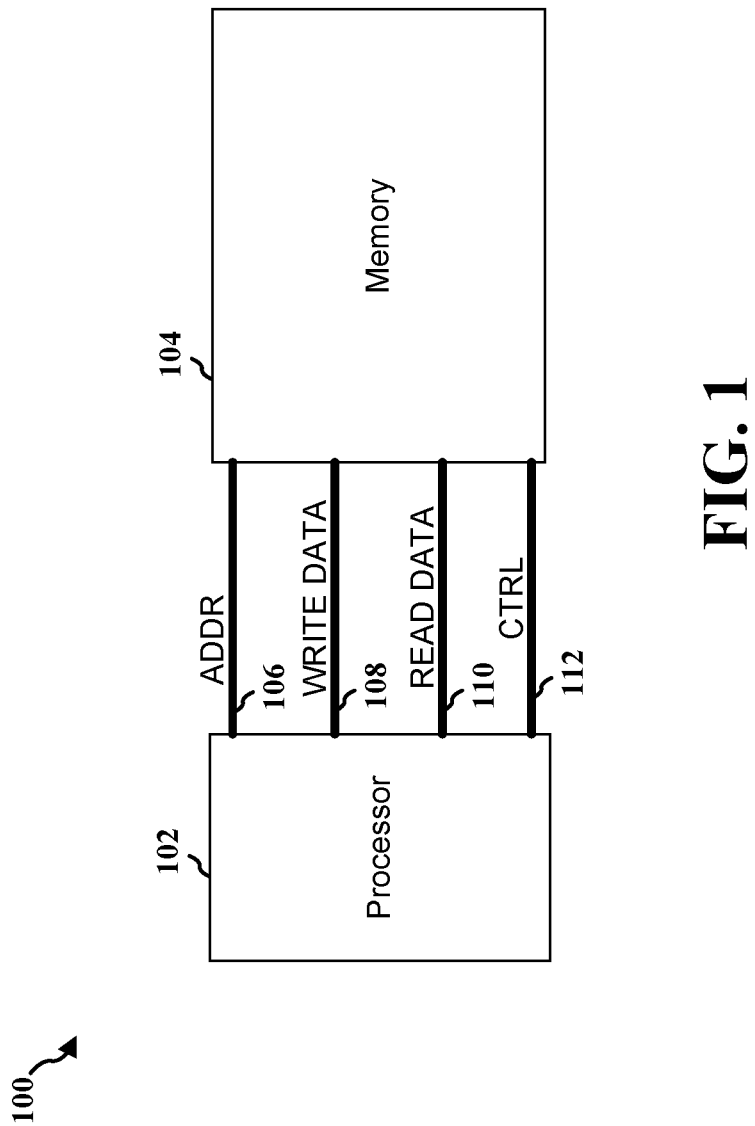
FIG. 1 is a conceptual block diagram illustrating an example of a processing system.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. These concepts may be practiced without these specific details, however, as will be apparent to those skilled in the art. In some instances, well-known structures and components are shown in block diagram form in order to avoid obscuring such concepts. Acronyms and other descriptive terminology may be used merely for convenience and clarity and are not intended to limit any concept disclosed herein.

Various memories presented throughout this disclosure may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of those elements. Rather, these designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Examples of other memories include random access memory (RAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable memory. Accordingly, all references to an SRAM are intended only to illustrate exemplary aspects of memory with the understanding that such aspects may be extended to a wide range of applications.

FIG. 1 is a conceptual block diagram illustrating an example of a processing system 100. The processing system 100 includes a processor 102 and a memory 104. The processor 102 may be a microprocessor, microcontroller, digital signal processor (DSP), programmable logic implementing a processor, or other processing circuitry. The memory 104 may be a multibank memory, such as a synchronous dynamic random access memory (SDRAM), or any other multibank component capable of retrieving and storing information.

The processor 102 illustrated in FIG. 1 is connected to the memory 104. The connections between the processor 102 and the memory 104 may include an address bus 106, a write data bus 108, a read data bus 110, and a control bus 112. The write data bus 108 may be used to write data from the processor 102 to the memory 104. The control bus 112 may include signals used to control the writing of data from the processor 102 to the memory 104. The read data bus 110 may be used to read data from the memory 104 to the processor 102. The control bus 112 may include signals used to control the reading of data from the memory 104 to the processor 102. For example, the control bus 112 may include signals such as a read signal and a write signal. The read signal may be a single signal line, e.g., a single bit, that indicates when the memory is being read by the processor 102. The write signal may be a single signal line that indicates when the memory is being written by the processor 102. In some examples, the control bus 112 may also include a byte enable signal. The byte enable signal may be a group of signal lines that indicate the size of the data, e.g., 8, 16, 32, 64 bytes. In some examples, however, the size of the data may be fixed, e.g., one of 8, 16, 32, 64 bytes. Accordingly, the byte enable signal may be optional on the control bus 112.

Other optional signals that may be part of the control bus 112 include, but are not limited to, transfer acknowledgment (ACK), bus request, bus grant, interrupt request, one or more clock signals, and a reset signal. The transfer acknowledge signal may indicate that data is acknowledged by a device, e.g., the processor 102, as having been read. The bus request may indicate that a device, e.g., the processor 102 or the memory 104 is requesting the bus, e.g., the processor 102 or the memory 104 is requesting use of the address bus 106 and one of the write data bus 108 or the read data bus 110. The bus grant may indicate that the processor 102 has granted access to the bus. The interrupt request may indicate to the processor 102 that a lower priority device is requesting the bus. Any clock signals on the control bus 112 may be used to synchronize devices on the control bus 112 such as the processor 102, the memory 104, or both. The reset may be used to reset the processor 102, the memory 104, or both. The signals described above as optional may not be used in the example systems described herein, but may be used in a particular implementation of the systems and methods described.

The control bus 112 may include a read signal and a write signal. The read signal and the write signal may be used to generate a read enable and a write enable, respectively, within the memory 104 as will be discussed in greater detail with respect to FIG. 3.

The address bus 106 may be used to indicate which location within the memory 104 the processor is reading or writing. For example, if the processor 102 wishes to read a memory location in the memory 104 the processor 102 may output the address of the memory location on the address bus 106. Additionally, the processor 102 may drive the read signal, which may be part of the control bus 112, active. The memory 104 may then output the data in the memory location indicated by the address bus 106 on the read data bus 110. Similarly, if the processor 102 wishes to write a memory location in the memory 104, the processor may output the address of the memory location to be written on the address bus 106. Additionally, the processor 102 may drive the write signal, which may be part of the control bus 112, active. The processor 102 may drive the write data bus 108 with the data that is to be written to the memory 104.

The write data bus 108 and the read data bus 110 are illustrated as separate buses in FIG. 1. In other examples, however, a single bidirectional data bus may be used to write data from the processor 102 to the memory 104 and to read data from the memory 104 to the processor 102. Systems using a single bidirectional data bus may be used to write data from the processor 102 to the memory 104 and to read data from the memory 104 to the processor 102 may include various control signals to allow for the use of a single bidirectional data bus, such as a read/write signal and a data valid signal. The read/write signal may indicate when data is being read or written. The data valid signal may indicate if data on the bidirectional data bus is valid data.

Figure 2:
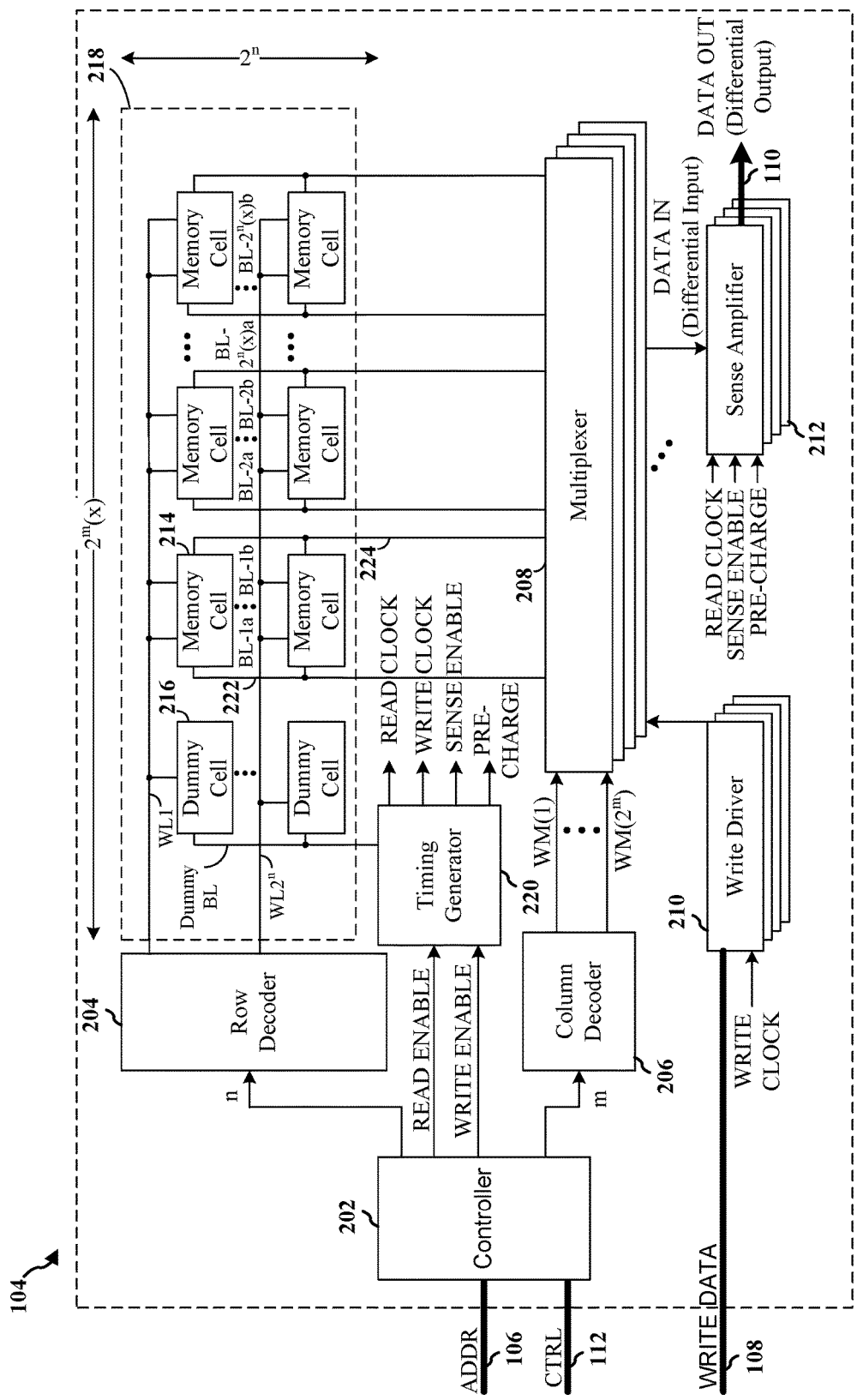
FIG. 2 is a functional block diagram of an exemplary embodiment of an SRAM.

FIG. 2 is a functional block diagram of an exemplary embodiment of a memory 104. The memory bank may be a static random-access memory (SRAM). The memory 104 may include a memory array 218 with supporting circuitry to decode addresses and perform read and write operations. The memory array 218 may be comprised of memory cells 214 for storing data. For example, the memory cell 214 may be a bit cell storing a bit of data. Accordingly, a memory cell such as memory cell 214 in memory 104 may provide a means for storing a first bit.

The memory cell 214 may be arranged to share connections in horizontal rows and vertical columns. Specifically, each horizontal row of memory cells 214 may share a wordline WL, and each vertical column of memory cells 214 may share a pair of bitlines (e.g., BL-1$a$ 222 and BL-1$b$ 224). The size of the memory array 218 (i.e., the number of cells) may vary depending on a variety of factors including the specific application, the speed requirements, die layout constraints and testing requirements, and the overall design constraints imposed on the system. The memory array 218 may contain thousands or millions of memory cells.

In the exemplary embodiment of the memory 104 illustrated in FIG. 2, the memory array 218 may include (2n·2m (x)) memory cells 214 arranged in 2n horizontal rows and 2m(x) vertical columns, where 2m is the number of words per row and x is the number of bits per word. A peripheral device (not shown) may randomly access any word (i.e., x cells) in the memory array 218 using an (n+m) bit wide address that is provided through a controller 202 to a row decoder 204 and column decoder 206, respectively. As will be described in greater detail later, the controller 202 may be responsible for the memory read and write operations. For example, the controller may provide the timing for the read and write operations in memory a cycles. The output from the controller 202 may include an n-bit address provided to the input of a row decoder 204, and an m-bit address provided to the input of a column decoder 206. The column decoder 206 provides 2m outputs (WM(1)-WM(2m)) with a different one of the outputs asserted for each different combination of address inputs.

The outputs are provided to x multiplexers 208. For a write memory access, each multiplexer is a 2m:1 multiplexer which switches one of x inputs from a write driver 210 between 2m bitline pairs based on the outputs from the column decoder 206. By way of example, a memory array that stores four (4) 128-bit words per row requires 128 4:1 multiplexers. Each multiplexer input is coupled to one of 328 outputs from the write driver 210. Based on the decoded m-bit address, each multiplexer input may be coupled from the write driver 210 to one of 4 bitline pairs. The 4 bitline pairs may be coupled to four memory cells, each storing a corresponding bit for a different word in a row. For example, the first of the 4 memory cells may store the least significant bit (LSB) of the first word, the second of the 4 memory cells may store the LSB of the second word, the third of the 4 memory cells may store the LSB of the third word, and the fourth of the 4 memory cells may store the LSB of the fourth word.

Thus, when the WRITE ENABLE signal from the controller 202 is asserted, the write driver 210 outputs the Write Data received from the peripheral device (not shown) to x pairs of bitlines BL-a and BL-b with each of the x multiplexers driving one pair of bitlines (e.g., BL-1a and BL-1b). The row decoder 204 converts the n-bit address into 2n wordline outputs. A different wordline WL is asserted by the row decoder 204 for each different n-bit row address. As a result, each of the 2m(x) memory cells 214 in the horizontal row with the asserted wordline WL is connected to one pair of the 2m(x) bitlines (e.g., BL-1a and BL-1b) through each memory cells 214 access transistors, as will be described in more detail below with reference to FIG. 3. The write data is driven, through the x multiplexers 208, onto the selected pairs of bitlines (e.g., BL-1a and BL-1b) and written to the memory cells with the asserted wordline WL.

For a read memory access, the row decoder 204 converts the n-bit address into one of the 2n read wordlines. A different read wordline WL is selected by the row decoder 204 for each different n-bit row address. As a result, each of the 2m(x) memory cells in the horizontal row with the selected read wordline WL is connected to one of the 2m(x) read bitlines BL through its access transistor, as will be described in more detail below with reference to FIG. 3. The 2m(x) read bitlines BL are used to transmit the bits stored by the 2m(x) memory cells to the x multiplexers 208, with each multiplexer 208 selecting one bit from the 2m bits transmitted on the read bitlines BL to the input of that multiplexer 208. The selected bits from the x multiplexers 208 are provided to the sense amplifier 212 for outputting the read data bus 110. Accordingly, a sense amplifier, such as the sense amplifier 212 in memory 104 may provide a means for generating a first data bit output as a function of the first bit when a first read enable is active. After the READ ENABLE signal generated by the controller 202 is asserted, the selected bits are ready for the sense amplifier 212. The READ ENABLE from the controller 202 may be used to generate the READ CLOCK. Additionally, the controller 202 may generate the n and m signals for the row and column decoders, respectively. Data from the multiplexer 208 into the sense amplifier 212 (DATA IN) may be available after the bitline BL and the wordline WL are selected, e.g., based on the n and m signals, and after the READ CLOCK is generated. Generally, there may be a delay from when the bitline BL and the wordline WL and the READ CLOCK are selected and when data from the multiplexer 208 into the sense amplifier 212 (DATA IN) is available because accessing the memory and propagating through the multiplexer 208 may take time.

As mentioned earlier, the controller 202 is responsible for memory operations by providing the timing for the read and write operations in a memory cycle. The memory cycle may be defined by the SYSTEM CLOCK input to the controller 202. The timing of the read and write operation is derived from internal READ and WRITE CLOCKS that are used to respectively multiplex READ and WRITE ADDRESS inputs from a peripheral device to the address decoder (i.e., row decoders 204 and column decoders 206). The READ clock is set by the READ ENABLE and reset by the READ CLOCK RESET. Similarly, the WRITE CLOCK is set by the WRITE ENABLE once the read operation is complete and reset by the WRITE CLOCK RESET. The READ and WRITE ENABLES may be input to the controller 202 from a peripheral device and controlled by the peripheral device. The READ CLOCK and WRITE CLOCK RESET may be generated by a tracking circuit in the memory array 218 and input to the controller 202. The READ ENABLE may be used to generate the READ CLOCK. The WRITE ENABLE may be used to generate the WRITE CLOCK. The READ CLOCK may be generated by the timing generator 220. The timing generator 220 may be configured to control the timing of the READ CLOCK so that the sense amplifier 212 is active when the DATA IN signal(s) are valid. Similarly, the timing generator 220 may be configured to control the timing of the WRITE CLOCK so that the Write Driver 210 is active when the DWRITE DATA signal(s) are valid.

In an example, the write driver 210 may be configured to drive the bitline (BL/BLB) to write a bit to the memory cell during a write operation and to float the bitline to mask the bit during the write operation.

As used herein, the terms "set" and "reset" with respect to a clock or other signal may describe two different logic states of such clock or other signal regardless of polarity. By way of example, a clock or other signal may be described as having a high logic state (e.g., a logic level "1") when set and a low logic state (e.g., logic "0") when reset. Alternatively, the clock or other signal may be described as having a low logic state when set and a high logic state when reset, as might be the case with an inverted clock or signal. Accordingly, the terms "set" and "reset" as used herein shall have no defined polarity, but rather shall be construed broadly to mean different logic states with reference to one another.

In the described exemplary embodiment, the tracking circuit may include a column of dummy cells, e.g., dummy cell 216, in the memory array. Dummy cells, such as dummy cell 216, may be used to determine when data from a memory cell, such as memory cell 214, is valid. Each dummy cell 216 is configured to emulate the operation of a row of memory cells 214. Each dummy cell 216 is connected to the same WL for its row of memory cells 214. (Accordingly, there may be a dummy cell for each row so that each row may be monitored based on that row's dummy cell, e.g., dummy cell 216.) A timing generator 220 may be used to monitor the Dummy bit line (BL) from the dummy cell 216 connected to the asserted WL. Specifically, the timing generator threshold detects the Dummy BL to track the access time of the selected memory cell 214 during read and/or write operations.

By way of example, during a read operation, the timing generator 220 monitors the dummy BL and may reset the READ CLOCK when a known bit stored in the dummy cell 216 appears on the Dummy BL. (For example, the timing generator 220 may monitor the dummy BL to determine when the dummy BL changes from one logic state to another logic state. The change in logic state may indicate that data on the corresponding memory cell bit lines is valid.) Similarly, during a write operation, the timing generator 220 monitors the Dummy BL and resets the WRITE CLOCK when a known bit written to the dummy cell by the write driver 210 appears on the Dummy BL. (For example, the timing generator 220 may monitor the dummy BL to determine when the dummy BL changes from one logic state to another logic state. The change in logic state may indicate that data on the corresponding memory cell bit lines is valid.) In at least one exemplary embodiment, the timing generator 220 may also be used to generate a WRITE READY signal. The WRITE READY signal may be used by the controller to satisfy certain internal timing constraints of the write operation following the read operation. Each memory cell 214 is configured to store one bit of data (e.g., a logic level "1" or a logic level "0").

Figure 3:
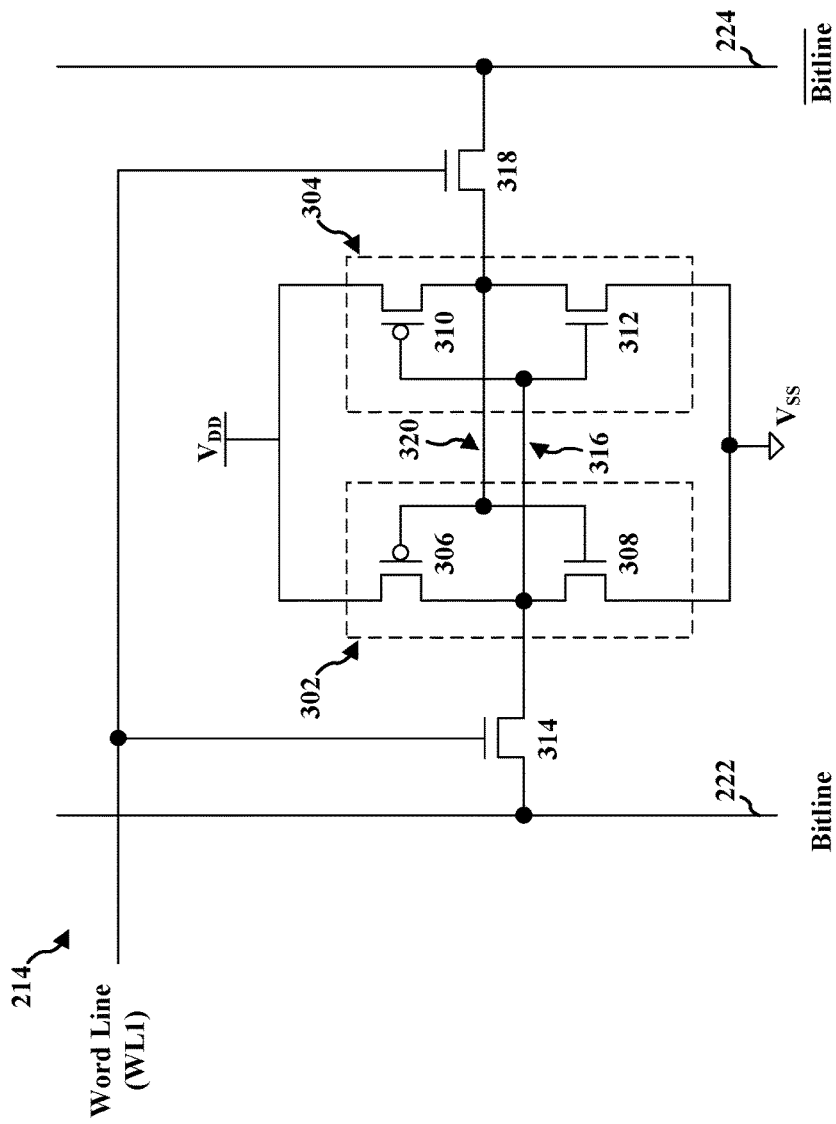
FIG. 3 is a schematic diagram of an exemplary embodiment of a memory cell for an SRAM.

FIG. 3 is a schematic diagram of an exemplary embodiment of the memory cell 214 of FIG. 2 of a memory bank. The memory cell 214 illustrated in FIG. 3 is a six-transistor (6T) configuration. However, as those skilled in the art will readily appreciate, the memory cell 214 may be implemented with a four-transistor (4T) configuration, an eight transistor (8T) configuration, a ten transistor (10T) configuration, or any other suitable transistor configuration that may be used to implement a memory cell.

The memory cell 214 is illustrated with two inverters 302, 304. The first inverter 302 includes a p-channel metal-oxide-semiconductor field effect (PMOS) 306 and an n-channel metal-oxide-semiconductor field effect (NMOS) 308. The second inverter 304 includes a PMOS transistor 310 and an NMOS transistor 312. In the described embodiment, the inverters 302 and 304 are powered by VDD and have a return VSS (e.g., ground). The first inverter 302 and the second inverter 304 are interconnected to form a cross-coupled latch. A first NMOS access transistor 314 couples the output node 316 from the second inverter 304 to a bitline BL-a, and a second NMOS access transistor 318 couples the output node 320 from the first inverter 302 to a bitline BL-b (the value of which is the opposite or inverse of the bitline BL-a). The gates of the NMOS access transistors 314, 318 are coupled to a wordline WL.

A write operation may be performed by setting the bitlines BL-a and BL-b to the value to be written to the memory cell 214 and asserting the wordline WL. The wordline WL may be asserted before the value to be written (e.g., write data) is provided to the bitlines BL-a and BL-b. By way of example, a low value, e.g., a logic level "1" may be written to the memory cell 214 by setting the bitline BL-a to a logic level 0 and the bitline BL-b to a logic level "1." The logic level 0 at the bitline BL-a is applied to the inverter 304 through the first NMOS access transistor 314, which in turn forces the output node 320 of the second inverter 304 to VDD. The output node 320 of the second inverter 304 is applied to the input of the first inverter 302, which in turn forces the output node 316 of the first inverter 302 to VSS. A logic level 0 may be written to the memory cell 214 by inverting the values of the bitlines BL-a and BL-b. The write driver 210 may be designed to be stronger than pull-up transistors (PMOS transistor 306 and PMOS transistor 310) in the memory cell 214 so that the write driver 210 can override the previous state of the cross-coupled inverters 302, 304.

Once the write operation is complete, the wordline is de-asserted, thereby causing the NMOS access transistors 314 and 318 to disconnect the bitlines BL-a and BL-b from the two inverters 302, 304. The cross-coupling between the two inverters 302, 304 maintains the state of the inverter outputs as long as power is applied to the memory cell 214.

The memory cell 214 stores data according to the data values stored at output nodes 316 and 320. If the memory cell 214 stores a logic high (i.e., a '1'), then output node 316 is at a logic high and output node 320 is at a logic low (i.e., a '0'). If the memory cell 214 stores a logic low, then output node 316 is at a logic low and output node 320 is at logic high. During a read operation, differential bit lines BL-1*a* and BL-1*b* may be pre-charged by a pre-charge circuit. The word line WL is then asserted, thereby turning on NMOS access transistors 314, 318. The timing between the pre-charging and asserting the wordline WL may be controlled by the row decoder 204.

If memory cell 214 stores a logic high, then bit line BL-1*a* remains charged via the first NMOS access transistor 314, and complimentary bit line BL-1*b* is discharged via the second NMOS transistor 318. If memory cell 214 stores a logic low, then bit line BL-1*a* is discharged via the first NMOS access transistor 314, and complimentary bit line BL-1*b* remains charged via the second NMOS access transistor 318.

Figure 4:
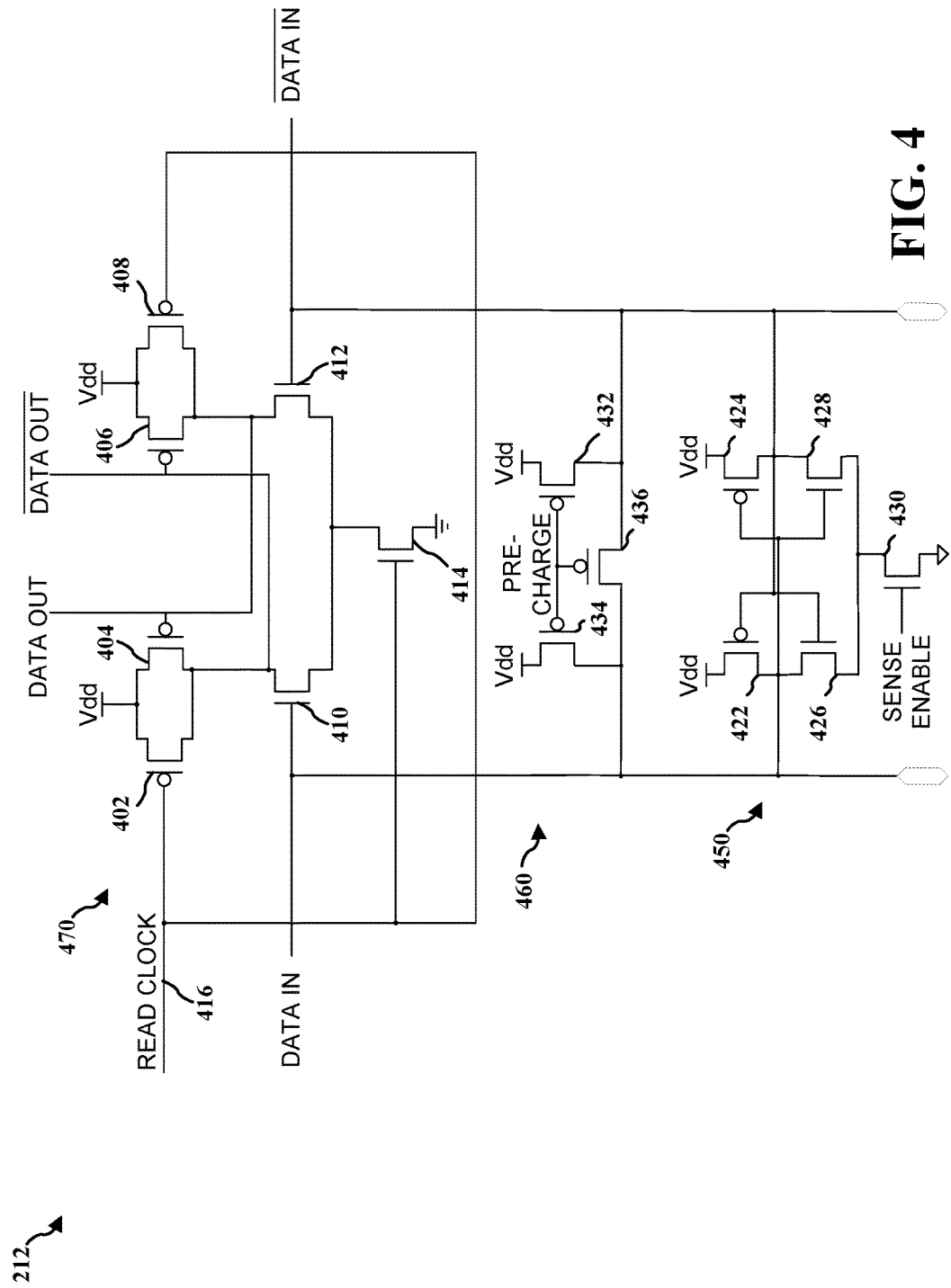
FIG. 4 is a conceptual block diagram illustrating an example of the sense amplifier of FIG. 2.

FIG. 4 is a conceptual block diagram illustrating an example of the sense amplifier 212. The example sense amplifier 212 may include sense amplifier circuitry 450, pre-charge circuitry 460, dynamic level shifter circuitry 470, or some combination of the sense amplifier circuitry 450, the pre-charge circuitry 460, or the dynamic level shifter circuitry 470. Other examples may provide data directly from the multiplexer 208 of FIG. 2. In other words, the sense amplifier 212 may be optional in some example memories 104. Various combinations of one, two, or all three of the sense amplifier circuitry 450, the pre-charge circuitry 460, or the dynamic level shifter circuitry 470 may be used. The example sense amplifier 212 may be used to generate the differential dataout from the memory 104.

The sense amplifier 212 in the illustrated example of FIG. 4 includes the sense amplifier circuitry 450. The sense amplifier circuitry 450 includes PMOS transistors 422, 424, and NMOS transistors 426, 428, 430. When the sense enable signal is high, the NMOS transistor 430 will be on. When the NMOS transistor 430 is on, a pair of cross coupled inverters, formed by PMOS transistor 422 and NMOS transistor 426, and formed by PMOS transistor 424 and NMOS transistor 428, are connected between power (Vdd) and ground. The cross coupled inverter (PMOS transistor 422 and NMOS transistor 426) inverts the data in signal and drives the inverse data in signal. Similarly, the cross coupled inverter (PMOS transistor 424 and NMOS transistor 428) inverts the inverse data in signal and drives the data in signal. Accordingly, the data in signal and the inverse data in signal will be driven to the inverse of each other when the sense enable signal is active. When the sense enable signal is inactive (low), the NMOS transistor 430 will be off and the pair of cross coupled inverters are not connected between power (Vdd) and ground. Accordingly, the cross coupled inverters will be unpowered and will not drive the data in signal and the inverse data in signal.

The sense amplifier 212 in the illustrated example of FIG. 4 includes the pre-charge circuitry 460. The pre-charge circuitry 460 includes PMOS transistors 432, 434, 436. When the pre-charge signal, which is an active low signal in the illustrated example, is active, each of the PMOS transistors 432, 434, 436 is on. When each of the PMOS transistors 432, 434, 436 is on, a data in signal and an inverse data in signal is pulled high. The data in signal is pulled high through PMOS transistor 434 as well as through PMOS transistors 436, 432. The inverse data in signal is pulled high through PMOS transistor 432 as well as through PMOS transistors 436, 434. The data in signal and the inverse data in signal are coupled together through the PMOS transistor 436 when the PMOS transistor 436 is active. When the pre-charge signal is not active, each of the PMOS transistors 432, 434, 436 is off. When each of the PMOS transistors 432, 434, 436 is off the data in signal and the inverse data in signal are not pulled high by the pre-charge circuitry 460, nor are the data in signal and the inverse data in signal coupled together through the PMOS transistor 436 (which is off).

The sense amplifier 212 in the illustrated example of FIG. 4 includes the dynamic level shifter circuitry 470. The dynamic level shifter circuitry 470 includes PMOS transistors 402, 404, 406, 408 and NMOS transistors 410, 412, 414. When the read clock signal is low the PMOS transistors 402, 408 are active. Accordingly, the dataout signal and the inverse dataout signal will both be high because the dataout signal is pulled high through the PMOS transistor 408 and the inverse dataout signal is pulled high through PMOS transistor 402. Note that because both of the dataout and the inverse dataout signals are high the PMOS transistors 404, 406 is off. Additionally, at the same time, the NMOS transistor 414, which is connected to the read clock signal is off, which prevents Vdd from shorting to ground (if one of NMOS transistors 410, 412 are active). When the read clock signal is low, the corresponding memory 104 is not selected.

When the read clock signal is high, the PMOS transistors 402, 408 are off and the NMOS transistor 414 is on. One of the dataout or inverse dataout signals is pulled low through the NMOS transistor 414 and by one of the NMOS transistors 410 or 412 depending on the state of the data in signal and the inverse data in signal. For example, assuming the data in signal is high and the inverse data in signal is low, the inverse dataout signal is pulled low through NMOS transistor 410 and NMOS transistor 414. The dataout signal will remain high because the NMOS transistor 412 is not on and thus, the dataout signal is not pulled low. Similarly, if the data in signal is low and the inverse data in signal is high, the dataout signal is pulled low through the NMOS transistor 412 and the NMOS transistor 410 will not be on. Accordingly, the inverse dataout signal will remain high because the inverse dataout signal is not pulled low by the NMOS transistor 410 and the NMOS transistor 414.

Figure 5:
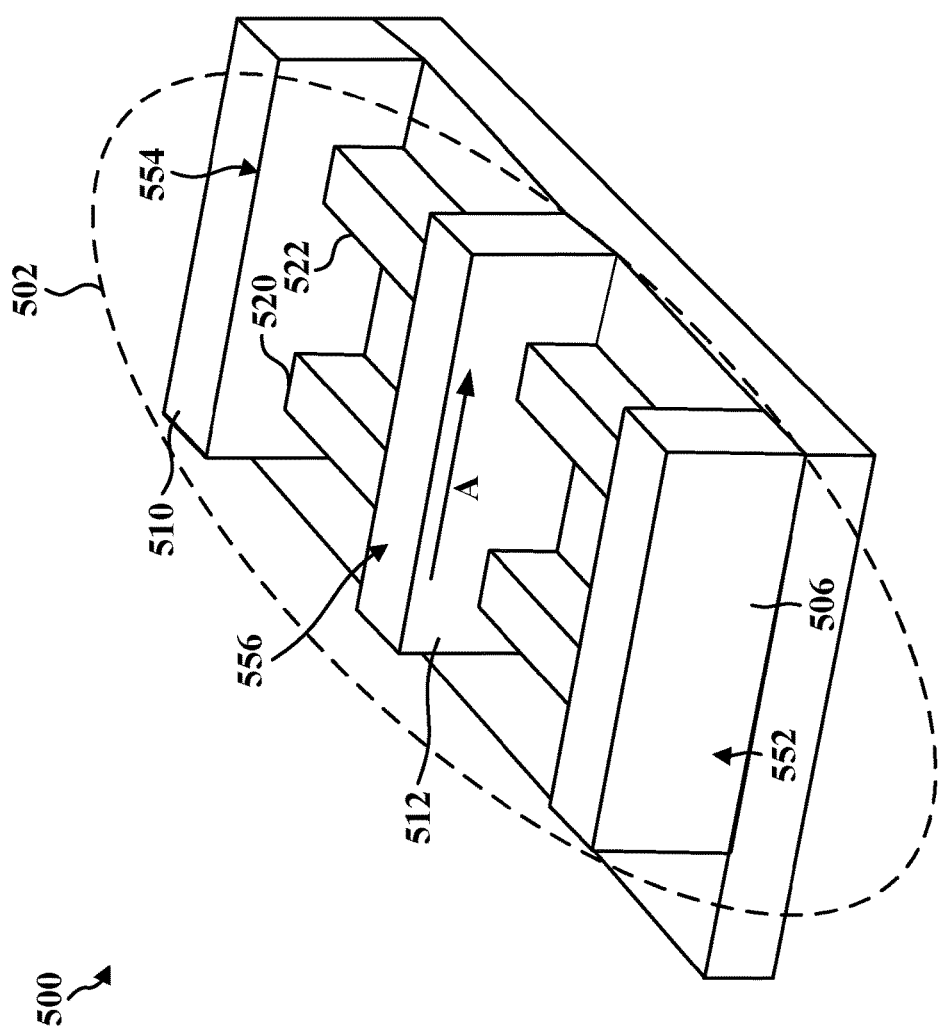
FIG. 5 is a diagram illustrating an exemplary layout of a MOS device including a FinFET.

FIG. 5 is a diagram 500 illustrating an exemplary layout of a MOS device including a FinFET 502. Referring to FIG. 5, the example FinFET 502 has a transistor source 552, a transistor drain 554, a transistor gate 556, and a set of transistor fins 520, 522. The set of transistor fins 520, 522 extends from the transistor gate 556. The set of transistor fins 520, 522 extend through the transistor gate 556 such that the transistor gate 556 surrounds the set of transistor fins 520, 522 on at least three sides. The set of transistor fins 520, 522 and the second interconnect 506 form the transistor source 552. The set of transistor fins 520, 522 and the first interconnect 510 form the transistor drain 554.

The gate interconnect 512 extends linearly in direction A to form the transistor gate 556. The transistor drain 554 is on the first side of the gate interconnect 512. The transistor source 552 is on the second side of the gate interconnect 512. The interconnects 510, 506, 508 may be referred to as first, second, and third interconnects, respectively. The first interconnect 510 on the first side of the gate interconnect 512 connects together the set of transistor fins 520, 522 at the transistor drain 554. The second interconnect 506 on the second side of the gate interconnect 512 connects together the set of transistor fins 520, 522 at the transistor source 552.

In some examples, e.g., particularly in some semiconductor processes, one or more of more transistor fin 520, 522 of the set of transistor fins 520, 522 may be cracked. The FinFET 502 may have a cracked fin. A transistor having a transistor fin 520, 522 with a crack may be modeled as a resistor, rather than a transistor. More specifically, a transistor having a cracked transistor fin 520, 522 may be modeled as a resistor between the source connection of the transistor and the drain connection of the transistor. The gate connection may be modeled as an infinite resistance, e.g., no connection.

Figure 6:
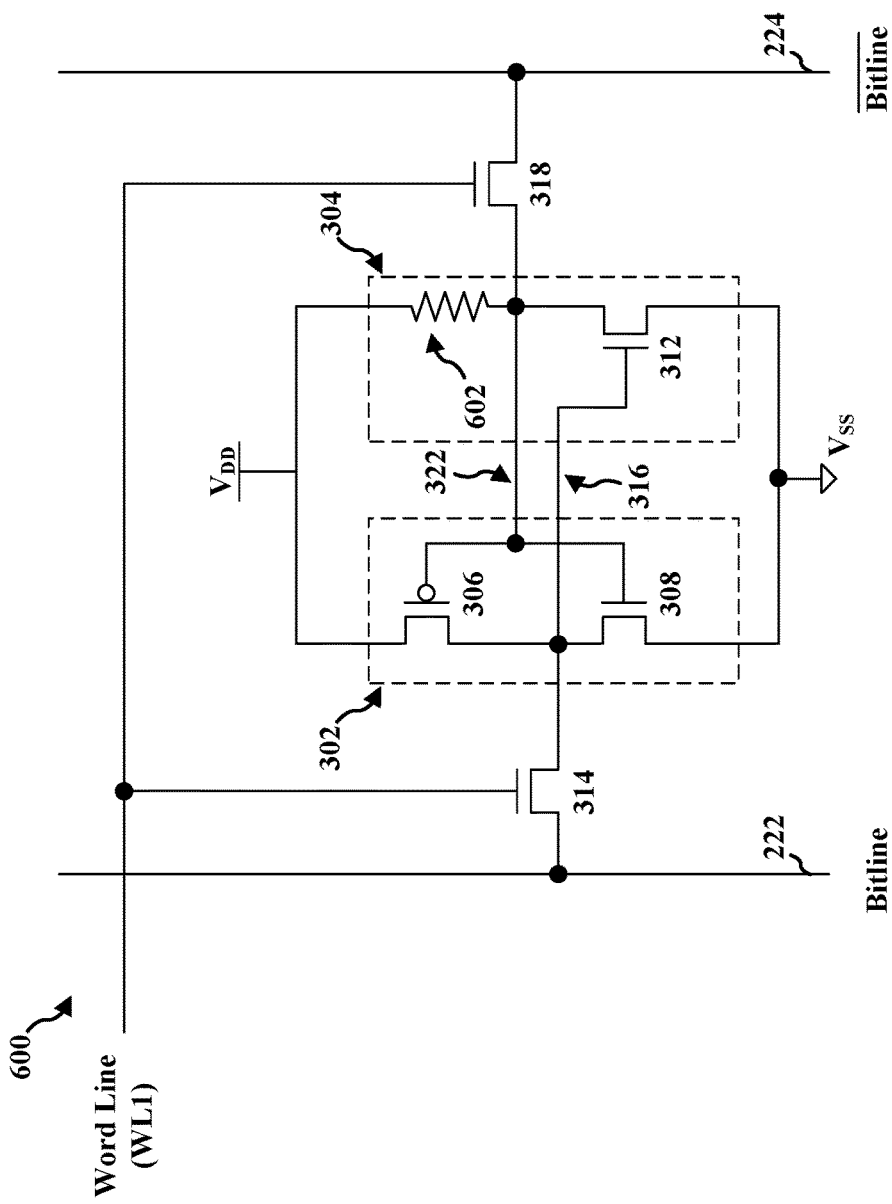
FIG. 6 is a schematic diagram of an exemplary embodiment of a memory cell for an SRAM.

FIG. 6 is a schematic diagram of an exemplary embodiment of the memory cell 600 of FIG. 2. The memory cell 600 illustrated in FIG. 6 is a six-transistor (6T) configuration. However, as those skilled in the art will readily appreciate, the memory cell may be implemented with a four-transistor (4T) configuration, an eight transistor (8T) configuration, a ten transistor (10T) configuration, or any other suitable transistor configuration that may be used to implement a memory cell.

The memory cell 600 is illustrated with two inverters 302, 304. The first inverter 302 includes a PMOS transistor 306 and an NMOS transistor 308. The second inverter 304, however, may have an example PMOS transistor (e.g., in the position of the PMOS transistor 310 of FIG. 3) with a crack in a fin and an NMOS transistor 312. (In other examples, other PMOS transistors or NMOS transistors may have a crack in a fin.) In the example, because the PMOS transistor in the position of the PMOS transistor 310 of FIG. 3 has a crack in a fin, the PMOS transistor may be modeled as a resistor, e.g., a pullup resistor 602. More specifically, a transistor having a cracked transistor fin 520, 522 may be modeled as a resistor between the source connection of the transistor and the drain connection of the transistor. The gate connection may be modeled as an infinite resistance, e.g., no connection.

Some silicon processes that have been observed to have a problem with fin cracking, i.e., the physical structure of the fin of a FinFET cracking, include, but may not be limited to HD111 and/or HC122 silicon processes for 8T/10T transistor SRAMs that are high speed (HS) and a high voltage. In some cases, fin cracking may also lead to bitcell failures for a low voltage and non-volatile bitcells.

As illustrated in FIG. 6, a cracked fin may cause the transistor to act as a resistor 620. Fin cracking may be found in both PMOS transistors and NMOS transistors. An NMOS fin crack may be more easily screened than a PMOS fin crack. Accordingly, the systems and methods described herein may generally be applied to PMOS transistors. NMOS transistors may, in some cases, be screened in other ways rather than using the systems and methods described herein. In the illustrate example of FIG. 6, the PMOS pullup transistors at the location of the PMOS transistor 310 of FIG. 3 is cracked. Accordingly, the PMOS transistor in FIG. 6 at the location of the PMOS transistor 310 of FIG. 3 is illustrated as the pullup resistor 602. The fin crack failure mode may have a very low pullup current, Idsat. The PMOS pullup transistor (at the location of the PMOS transistor 310 of FIG. 3) may act as the pullup resistor 602 when a fin is cracked. The pullup resistor 602 may generally be a weak pullup resistor, e.g., a high resistance. A high resistance, e.g., in the range of approximately 100 kohms to 800 kohms, for a pullup, e.g., the pullup resistor 602, may lead to a low Idsat current, e.g., in the nanoamp range in some examples.

A failure mode for a fin crack in a transistor in a memory may be a decrease in read stability such that a bit flip may occur. A bit flip is when data in a memory location, e.g., a bit, changes states, e.g., from a logic "1" to a logic "0" or from a logic "0" to a logic "1," when the memory location is not being written. The chance of a bit flip may be dependent on temperature and voltage. For example, the chance of a bit flip may increase with increases in temperature and/or voltage. With a cracked fin, during a byte write mode, masked column bit lines (BLs) 222, 224 may be driven to 1 Vtn instead of a floating state. Unselected columns within a multiplexer may be in a half-selected condition. In other words, the voltage on bitlines 222, 224 that are not selected may be in an undefined state such as a voltage between the voltages for a logic "0" and a logic "1." The condition may be worse for full FS, high temperature, and/or high voltage.

Figure 7:
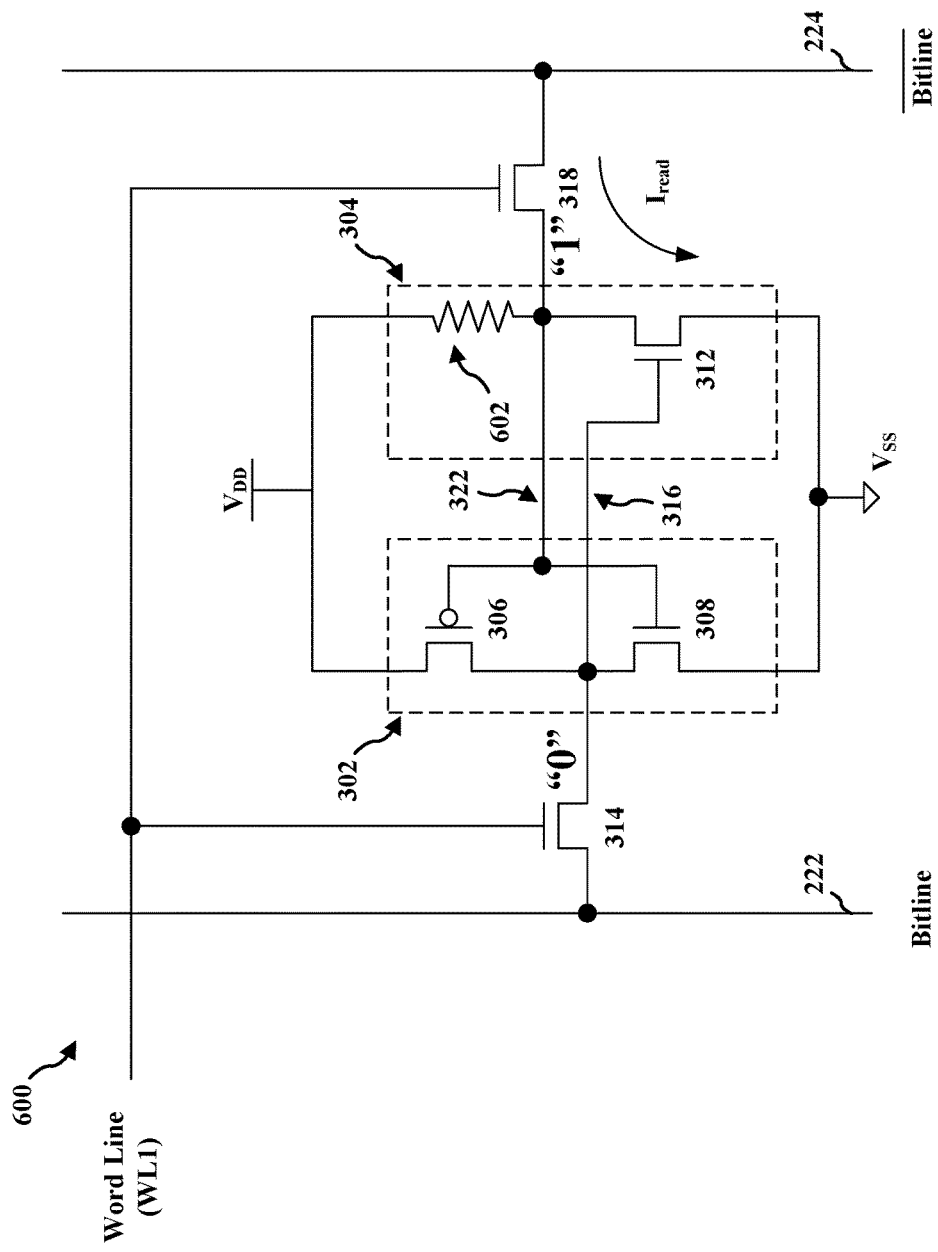
FIG. 7 is a schematic diagram of an exemplary embodiment of a memory cell for an SRAM.

FIG. 7 is a schematic diagram of the exemplary embodiment of the 6T memory cell 600. FIG. 7 illustrates an example write path for the 6T memory cell 600 with a cracked fin. When a byte write occurs, with write masking "on" or a non-selected multiplexer, the bitline will be driven at a 1 Vtn drop. In a case of high Vdd and hot temperature, there may be a chance of decreasing the margin such that an unintended write may occur when a fin is cracked.

In the example of FIG. 7, the PMOS transistor, which may be modeled as resistor 602, may add an additional pullup. Accordingly, the pass gate of the memory cell 600 (NMOS transistor 318) and the pull up transistor of the memory cell 600 (modeled as resistor 602) may overpower the pulldown transistor of the memory cell 600 (NMOS transistor 312), e.g., when a read occurs. Accordingly, a voltage for a logic "1" or near a voltage for a logic "1" may be at the output to the inverter 304, i.e., the inverter having a PMOS transistor modeled as the resistor 602, regardless of the value stored in the memory. Accordingly, the voltage for a logic "1" or near a voltage for a logic "1" may be at the input to the inverter 302. Accordingly, the output of the inverter 302 may be driven to a logic "0" during a read. When the bit stored in the memory cell 214 prior to the read is a logic "1," an undesired bit flip may occur. In other words, the bit stored in the memory may be a logic "0" prior to a read and may be flipped to an incorrect value, e.g., a logic "1" when a read occurs.

With a cracked fin, during a byte write mode, when the masked column bit lines (BLs) 222, 224 are floating instead of being driven to 1 Vtn the unselected columns within the multiplexer are not in a half-selected condition. When the bitlines are floating current will be much less likely to be driven through the NMOS transistor 318. Accordingly, the pass gate of the memory cell 600 (NMOS transistor 318) and the pull up transistor of the memory cell 600 (modeled as resistor 602) may be much less likely to overpower the pulldown transistor of the memory cell 600 (NMOS transistor 312), e.g., when a read occurs, because the bitlines are floating. Accordingly, an undesired bit flip may be much less likely to occur. In other words, when the bit stored in the memory is a logic "0" prior to a read the bit may be less likely to be flipped to an incorrect value, e.g., a logic "1" when a read occurs.

Figure 8:
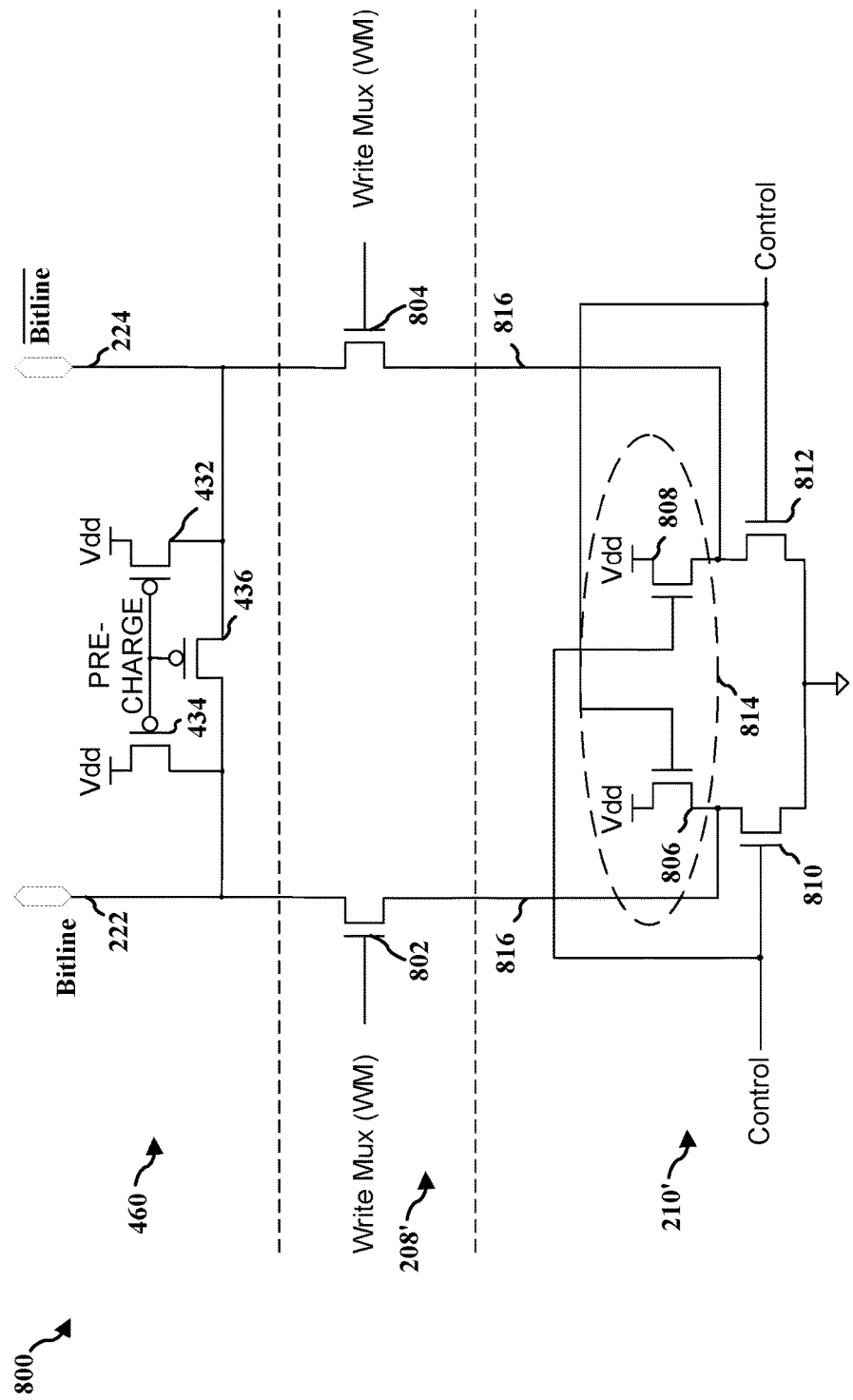
FIG. 8 is a conceptual block diagram illustrating an example circuit in accordance with the systems and methods described herein.

FIG. 8 is a conceptual block diagram illustrating an example circuit 800 in accordance with the systems and methods described herein. The circuit 800 includes the precharge circuit 460 including PMOS transistors 432, 434, 436. The circuit 800 also includes a single bit of the multiplexer 208 of FIG. 2 and a single bit of the write driver 210 of FIG. 2. The single bit of the write driver 210' is coupled to the single bit of the multiplexer 208'. The illustrated circuitry is double ended.

The single bit of the multiplexer 208' includes NMOS transistors 802, 804. The NMOS transistors 802, 804 may be controlled by the Write Mux signal, e.g., WM, WM(1) . . . WM(2$^m$). When the Write Mux signal is active, e.g., a logic "1," the NMOS transistors 802, 804 may allow the write driver 210' to drive the bitlines.

The write driver 210' includes NMOS transistors 806, 808, 810, 812. The NMOS transistors 806, 808 form NMOS pullups 814. The gates to the NMOS transistors 806, 808, 810, 812 may be driven low to make the inputs 816 to the write multiplexer 208' float. When the bitlines float, current will be much less likely to be driven through the NMOS transistor 318 (FIG. 7). Accordingly, a bit flip will be much less likely. The NMOS transistors 806, 808, 810, 812 may be controlled by a control signal. The control signal may be active during a read and inactive during a write. Accordingly, the bitlines may float during a read and be capable of being written during a write.

The circuit 800 may solve the fin crack issue observed in the various silicon processes. A design solution to overcome silicon failures observed in the various processes for bit/byte writable memories. By using the write driver scheme illustrates in FIG. 8, the write drivers may be set floating for a masked bit to ensure that no accidental writes happen. In the illustrated example of FIG. 8, the write driver uses NMOS transistors for pull up instead of the PMOS transistors that are typically used. Additionally, the gate driving the NMOS are driven low to make the inputs float at the source of write mux drivers.

As discussed above, with a cracked fin, during a byte write mode, when the masked column bit lines (BLs) 222, 224 are floating instead of being driven to 1 Vtn the unselected columns within the multiplexer are not in a half-selected condition. When the bitlines are floating current will be much less likely to be driven through the NMOS transistor 318 (see FIG. 7). Accordingly, the pass gate of the memory cell 600 (NMOS transistor 318) and the pull up transistor of the memory cell 600 (modeled as resistor 602) may be much less likely to overpower the pulldown transistor of the memory cell 600 (NMOS transistor 312), e.g., when a read occurs, because the bitlines are floating (see FIG. 7). Accordingly, an undesired bit flip may be much less likely to occur. In other words, when the bit stored in the memory is a logic "0" prior to a read the bit may be less likely to be flipped to an incorrect value, e.g., a logic "1" when a read occurs.

One aspect is a memory circuit (e.g., a subset of 104). The memory circuit (104) includes a memory cell (214) having a bitline. The memory circuit (104) also includes a write driver (210, 210') configured to drive the bitline to write a bit to the memory cell (214) during a write operation and to float the bitline to mask the bit during a read operation.

In an aspect, the write driver (210') includes a pullup circuit (814) includes a control input (control).

In an aspect, the pullup circuit (814) includes a pair of NMOS transistors (806, 808).

In an aspect, a write multiplexer circuit (208') including a multiplexer output coupled to the pullup circuit (814) and separate from the control input (control). The pullup circuit (814) may be configured to allow a multiplexer input to float based on the control input (control).

In an aspect, the write multiplexer circuit (208') includes NMOS transistors (802, 804).

In an aspect, a pulldown circuit (810, 812 in combination) is coupled to the pullup circuit (814) and the multiplexer (208') output. The pulldown circuit (810, 812) may be controlled by the control input (control).

In an aspect, the pulldown circuit (810, 812 in combination) includes a pair of NMOS transistors (810, 812).

In an aspect, a processing system (100) includes a processor (102). The processing system (100) also includes a memory circuit (e.g., a subset of 104) coupled to the processor (102). The memory circuit (104) includes a memory cell (214) having a bitline. The memory circuit (104) also includes a write driver (210, 210') configured to drive the bitline to write a bit to the memory cell (214) during a write operation and to float the bitline to mask the bit during the read operation.

In an aspect, a memory circuit (e.g., a subset of 104), includes means for storing a bit (e.g., the memory cell 214). The means for storing a bit (the memory cell 214) may have a bitline. The memory circuit (104) includes means for driving the bitline (write driver 210') to write the bit to the means for storing the bit (the memory cell 214) during a write operation and to float the bitline to mask the bit during the read operation.

In an aspect, the means for driving the bitline includes a pullup circuit (814) including a control input (control).

In an aspect, the pullup circuit (814) includes a pair of NMOS transistor (806, 808).

In an aspect, the means for multiplexing (208') includes an output coupled to the pullup circuit (814) and separate from the control input (control). The pullup circuit (816) may be configured to allow an input to the means for multiplexing (208') to float based on the control input (control).

In an aspect, the means for multiplexing (208') includes NMOS transistors (802, 804).

In an aspect, a pulldown circuit (810, 812 in combination) is coupled to the pullup circuit (816) and the output of the means to multiplex (208'). The pulldown circuit (810, 812 in combination) may be controlled by the control input (control).

In an aspect, the pulldown circuit (810, 812 in combination) includes a pair of NMOS transistors (810, 812).

It is understood that the specific order or hierarchy of blocks in the processes/flowcharts disclosed is an illustration of exemplary approaches. Based upon design preferences, the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A memory circuit, comprising:
   a memory cell having a bitline;
   a write driver having a pullup circuit configured to drive the bitline to write a bit to the memory cell during a write operation and to float the bitline to mask the bit during a read operation; and
   a write multiplexer circuit configured to switchably couple the pullup circuit to the bitline.

2. The memory circuit of claim 1, wherein the pullup circuit includes a pair of n-channel metal-oxide-semiconductor field effect (NMOS) transistors.

3. The memory circuit of claim 1, wherein the write multiplexer circuit comprises NMOS transistors.

4. The memory circuit of claim 1, further comprising a pulldown circuit coupled to the pullup circuit and the multiplexer output, the pulldown circuit controlled by the control input.

5. The memory circuit of claim 4, wherein the pulldown circuit comprises a pair of NMOS transistors.

6. A processing system comprising:
   a processor;
   a memory circuit coupled to the processor, the memory circuit including:
      a memory cell having a bitline, a write driver having a pullup circuit configured to drive the bitline to write a bit to the memory cell during a write operation and to float the bitline to mask the bit during a read operation; and a write multiplexer circuit configured to switchably couple the pullup circuit to the bitline.

7. The memory circuit of claim 6, wherein the pullup circuit includes a pair of n-channel metal-oxide-semiconductor field effect (NMOS) transistors.

8. The memory circuit of claim 6, wherein the write multiplexer circuit comprises NMOS transistors.

9. The memory circuit of claim 6, further comprising a pulldown circuit coupled to the pullup circuit and the multiplexer output, the pulldown circuit controlled by the control input.

10. The memory circuit of claim 9, wherein the pulldown circuit comprises a pair of NMOS transistors.

11. A memory circuit, comprising:

means for storing a bit, the means for storing a bit having a bitline;

means for driving the bitline to write the bit to the means for storing the bit during a write operation and to float the bitline to mask the bit during a read operation, the means for driving the bitline having a pullup circuit; and means for switchably coupling the pullup circuit to the bitline.

12. The memory circuit of claim 11, wherein the pullup circuit includes a pair of n-channel metal-oxide-semiconductor field effect (NMOS) transistors.

13. The memory circuit of claim 11, wherein the means for multiplexing comprises NMOS transistors.

14. The memory circuit of claim 11, further comprising a pulldown circuit coupled to the pullup circuit and the output of the means to multiplex, the pulldown circuit controlled by the control input.

15. The memory circuit of claim 14, wherein the pulldown circuit comprises a pair of NMOS transistors.

\* \* \* \* \*